United States Patent
Huang et al.

[19]

[11] Patent Number: 6,011,409
[45] Date of Patent: Jan. 4, 2000

[54] INPUT/OUTPUT BUFFER CAPABLE OF ACCEPTING AN INPUT LOGIC SIGNAL HIGHER IN VOLTAGE LEVEL THAN THE SYSTEM VOLTAGE

[75] Inventors: Jincheng Huang, Taipei; Yuantsang Liaw, Taichung, both of Taiwan

[73] Assignee: VIA Technologies, Inc., Taipei, Taiwan

[21] Appl. No.: 09/084,678

[22] Filed: May 26, 1998

[30] Foreign Application Priority Data

Apr. 14, 1998 [TW] Taiwan .................................. 87105615

[51] Int. Cl.[7] .............................................. H03K 19/0175
[52] U.S. Cl. ............................... 326/83; 326/57; 326/112; 326/119; 326/121
[58] Field of Search .................................. 326/57, 58, 80, 326/81, 82, 83, 112, 119, 121

[56] References Cited

U.S. PATENT DOCUMENTS 5,396,128  3/1995  Dunning et al. ........................... 326/68
5,748,011  5/1998  Takahashi et al. ......................... 326/83
5,929,667  7/1999  Adadeer et al. .......................... 327/112
5,933,025  8/1999  Nance et al. .............................. 326/81

*Primary Examiner*—Michael Tokar
*Assistant Examiner*—Anh Tran
*Attorney, Agent, or Firm*—Thomas, Kayden Horstemeyer & Risley

[57] ABSTRACT

An input/output (I/O) buffer is provided for use in an integrated circuit, which is designed in particular to be capable of accepting an input logic signal voltage higher in voltage level than the system voltage. The I/O buffer is designed in such a manner that when the input logic signal drops from the high-voltage logic state to the low-voltage logic state, the voltage at the floating N-well can be raised to near the level of the system voltage. This prevents a latchup effect that occurs in the prior art. Moreover, the I/O buffer can prevent both the output PMOS transistor and the output NMOS transistor from switching into a conducting state at the same time. This prevents the occurrence of an instant short-circuit current in the I/O buffer and also helps to improve the output performance of the I/O buffer.

6 Claims, 3 Drawing Sheets

INPUT/OUTPUT BUFFER CAPABLE OF ACCEPTING AN INPUT LOGIC SIGNAL HIGHER IN VOLTAGE LEVEL THAN THE SYSTEM VOLTAGE

CROSS-REFERENCE TO RELATED APPLICATION

This application claims the priority benefit of Taiwan application serial no. 87105615, filed Apr. 14, 1998, the full disclosure of which is incorporated herein by reference.

BACKGROUND OF THE INVENTION

1. Field of the Invention

This invention relates to input/output (I/O) buffers for use in integrated circuits (IC), and more particularly, to an I/O buffer for use in an IC device, which is capable of accepting an input logic signal higher in voltage level than the system voltage.

2. Description of Related Art

Conventionally, most IC devices are driven by a system voltage in the range of 0–5 V (volt). In these IC devices, the high-voltage logic signal is therefore set at the system voltage and the low-voltage logic signal is set at the ground voltage. With advances in semiconductor technology, however, the system voltage can be now reduced to 3.3 V because the gate oxide layers in the IC device can be made thinner. Still lower system voltage may be possible in the future. In practice, however, a new 3.3 V IC device is usually used in conjunction with some old 5 V peripheral devices. For instance, a new 3.3 V VGA (video graphic adapter) IC may be used in conjunction with other old 5 V peripheral devices in a personal computer. Therefore, the compatibility between the new 3.3 V devices and the old 5 V devices is a problem in the use of the new 3.3 V devices.

FIG. 1 is a schematic circuit diagram showing the circuit structure of a conventional I/O buffer used in a 3.3 V IC device, which is the part that is enclosed in the dashed box indicated by the reference numeral 14. As shown, the I/O buffer 14 is coupled to an input buffer 16 and an I/O pad 20 of the IC device. The I/O buffer 14 is composed of a first circuit 10, a second circuit 12, a PMOS transistor P1, and an NMOS transistor N1. When the I/O buffer operates in input mode, both the PMOS transistor P1 and the NMOS transistor N1 must be switched to a non-conducting state. To do this, the first circuit 10 outputs a high-voltage signal, for example 3.3 V, to the gate of the PMOS transistor P1, thereby switching the PMOS transistor P1 into a non-conducting state.

Meanwhile, the second circuit 12 outputs a low-voltage signal, for example 0 V, to the gate of the NMOS transistor N1, thereby switching the NMOS transistor N1 into a non-conducting state.

If the I/O pad 20 receives a 5 V input logic signal, it causes the PMOS transistor P1 to be subjected to a gate voltage of 3.3 V, a drain voltage of 5 V, and a source voltage of 3.3 V. Since the gate voltage (3.3 V) is lower than the drain voltage (5 V) at the PMOS transistor P1, the gate voltage causes the PMOS transistor P1 to be switched into a reverse conducting state. Moreover, since the PMOS transistor P1 is formed on an N-type substrate (or an N-well, which is typically equipotential with the source) and its source and drain are both P-type, a PN junction diode as indicated by the reference numeral 18 is formed between its drain and the N-well. Furthermore, since the drain of the PMOS transistor P1 is connected to the I/O pad 20, which is now receiving the 5 V input logic signal which is higher than the 3.3 V system voltage, and the substrate thereof is connected to the 3.3 V system voltage, the PN junction diode 18 will be subjected to a forward bias, thus causing an undesired large current to flow between the external 5 V source and the internal 3.3 V source.

As a solution to the foregoing problem, an improved I/O buffer for the 3.3 V IC devices has been proposed, which is published in the IEEE JSSC, July, 1995. FIG. 2 is a schematic diagram showing the circuit structure of this improved I/O buffer. In this diagram, the symbol "+" represents the application of a 3.3 V system voltage.

When this I/O buffer operates in output mode, the signal OEN=0 is issued to the I/O buffer, which then causes the gate voltage at the PMOS transistor P4 to be 0. As a result, the PMOS transistor P4 is switched into a conducting state, thereby causing the 3.3 V system voltage to be applied to the floating N-well 22.

On the other hand, when this I/O buffer operates in input mode, the PMOS transistor P1 and the NMOS transistor N1 are both switched into a non-conducting state, causing a 3.3 V high-voltage signal to be applied to the gate of the PMOS transistor P1 and a 0 V low-voltage signal to be applied to the gate of the NMOS transistor N1. As a result of this, if a 5 V input signal is applied to the I/O pad 24, the PMOS transistor P2 is subjected to a 3.3 V gate voltage and a 5 V drain voltage. Since at the PMOS transistor P2 the gate voltage (3.3 V) is lower than the drain voltage (5 V), the PMOS transistor P2 will be switched into a conducting state, thereby causing the potential at Node 2 to be raised to 5 V, thus inhibiting the PMOS transistor P1) from being switched into a reverse conducting state. Moreover, the condition of the I/0 pad 24 receiving a 5 V input signal also causes the PMOS transistor P6 to be switched into a conducting state, thereby causing the output voltage at the floating N-well 22 also to be 5 V. This then causes the diode D1 to be turned into a non-conducting state. As a result of this, the diode D2 between the drain of the PMOS transistor P1 and the N-well is not subjected to a large current. Therefore, the improved I/O buffer of FIG. 1 represents a solution to the problem of the I/O buffer of FIG. 1.

There are, however, still some drawbacks in the foregoing I/O buffer of FIG. 2. When this I/O buffer operates in input mode and the input signal at the I/O pad 24 is switched from 5 V to 0 V, the voltage at the floating N-well 22 should be set at 3.3 V. In reality, however, the voltage at the floating N-well 22 is lower than 3.3 V due to the following reasons. First, the condition of the I/O pad 24 receiving a 0 V input signal causes the PMOS transistor P6 to be switched into a non-conducting state; second, the PMOS transistor P4 is switched into a non-conducting state when the I/O buffer is operating in the input mode; third, a parasitic capacitor C1 exists between the floating N-well 22 and the I/O pad 24; fourth, the diode D3 that exists between the source of the PMOS transistor P1 and the floating N-well 22 will be turned into a conducting state when the voltage at the floating N-well 22 drops to 3.3—$V_D$ (where $V_D$ is about 0.5–0.6 V), which causes the voltage at the floating, N-well 22 to latch at 3.3—$V_D$ and not be retained at 3.3 V. This situation causes a latchup to the IC device, which can easily cause burn-out of the IC device.

When the I/O buffer is operating in output mode, the I/O pad 24 can be switched to the 3.3 V output voltage state simply by issuing OEN=0 and Dout=1 to respectively put Node 1 and Node 2 at 0 V state to thereby cause the PMOS transistor P1 to be switched into a conducting state and the NMOS transistor N1 to be switched into a non-conducting state. At the same time, the drain of the NMOS transistor N4, which is connected to the I/O pad 24, is also put into the 3.3 V state. Since the gate voltage at the NMOS transistor N4 is also 3.3 V, the source voltage at the NMOS transistor N4 is only about 2.3 V rather than 3.3 V, thus causing the voltage at Node 3 to be also 2.3 V. The voltage at Node 4 is therefore also 2.3 V when the NMOS transistor N5 is switched into a conducting state.

Furthermore, the output can be switched from 3.3 V to 0 V by issuing Dout=0 to cause the voltages at Node 1 and Node 2 to be raised from 0 V to 3.3 V. The voltage at Node 1, which is connected to the gate of the NMOS transistor N1, can be switched from 0 V to 3.3 V without problem. However, the voltage at Node 2, which is connected to the gate of the PMOS transistor P1, has a problem in the switching of its voltage state. This is because that the voltage at Node 2 is supplied from both the NMOS transistor N2 and the PMOS transistor P3, of which the NMOS transistor N2 has a faster switching speed. Therefore, during the time when the voltage at Node 2 is rising from 0 V to 3.3 V, the chance of the voltage state will slow down or even pause when the voltage reaches 2.3 V. Since the gate voltage at the PMOS transistor P3, i.e., the voltage at Node 4, is originally 2.3 V, it will not be promptly switched into a non-conducting state until the NMOS transistor N1 has been switched into a conducting state to cause the voltage at Node 3 to drop. This then causes the voltage at Node 4 to drop, thereby switching the PMOS transistor P3 into a conducting state, causing the voltage at Node 2 to exceed 2.3 V. As a result of this, the PMOS transistor P1 is switched into a non-conducting state. From the foregoing description, it is clear that the lengthy time required in the switching process will degrade the output performance of the I/O buffer. Moreover, since there exists a short period during which both the PMOS transistor P1 and the NMOS transistor N1 are in a conducting state, an instant short-circuit current can occur, which would cause damage to the I/O buffer.

SUMMARY OF THE INVENTION

It is therefore an objective of the present invention to provide a new circuit structure for the I/O buffer used in an IC device, which is capable of accepting an input logic signal voltage higher in voltage level than the system voltage, and which is particularly designed in such a manner that when the input logic signal drops from the high-voltage logic state to the low-voltage logic state, the voltage at the floating N-well can be raised to near the level of the system voltage. This prevents the latchup effect mentioned in the background section of this specification.

It is another objective of the present invention to provide a new circuit structure for the I/O buffer used in an IC device, which is capable of accepting an input logic signal voltage higher in voltage level than the system voltage, which is particularly designed in such a manner that it can prevent both the output PMOS transistor and the output NMOS transistor from simultaneously switching into a conducting state. This prevents the occurrence of an instant short-circuit current in the I/O buffer, as mentioned in the background section of this specification.

It is still another objective of the present invention to provide a new circuit structure for the I/O buffer used in an IC device, which is capable of accepting an input logic signal voltage higher in voltage level than the system voltage. This structure is particularly designed in such a manner that it can help improve the output performance of the I/O buffer.

In accordance with the foregoing, and other objectives of the present invention, an improved I/O buffer is provided for use in an IC device, which is capable of accepting an input logic signal voltage higher in voltage level than the system voltage.

Broadly speaking, the I/O buffer of the invention is provided for an IC device driven by a system voltage whose magnitude lies between a high-voltage logic state and a low-voltage logic state that are received by the I/O buffer. In one practical application, the system voltage is 3.3 V, while the low-voltage logic state is 0 V and the high-voltage logic state is 5 V. In other words, the I/O buffer receives an input logic signal which is switched between 0 V and 5 V, and the 5 V high-voltage logic state is larger than the 3.3 V system voltage.

The I/O buffer of the invention is designed in such a manner that when the input signal drops from the high-voltage logic state (5 V) to the low-voltage logic state (0 V), the voltage at the floating N-well can be raised to near the level of the system voltage (3.3 V). This design prevents the latchup effect that occurs in the prior art. Moreover, the I/O buffer can prevent both the output PMOS transistor and the output NMOS transistor from simultaneously switching into a conducting state. This prevents the occurrence of an instant short-circuit current in the I/O buffer and also help to improve the output performance of the I/O buffer.

In one preferred embodiment, the I/O buffer of the invention includes the following constituent elements:

a floating N-well;

first NMOS transistor whose gate is connected to receive a first gate control signal, whose source is connected to the ground, and whose drain is connected to a first node, a second NMOS transistor whose gate is connected to the system voltage, whose source is connected to the first node, and whose drain is connected to a second node connected to the I/O port;

a third NMOS transistor whose gate is connected to a first I/O control signal, whose source is connected to the ground, and whose drain is connected to a third node;

a fourth NMOS transistor whose grate is connected to the system voltage, whose source is connected to the third node, and whose drain is connected to a fourth node;

a fifth NMOS transistor whose gate is connected to a second I/O control signal, whose value is the complement of the first I/O control signal connected to the gate of the third NMOS transistor, whose source is connected to the first node, and whose drain is connected to the fourth node;

a first PMOS transistor whose gate is connected to the system voltage, whose source is connected to the I/O port, and whose drain is connected to the floating N-well;

a second PMOS transistor whose gate is connected to the fourth node, whose source is connected to the system voltage, and whose drain is connected to the floating N-well;

a third PMOS transistor whose gate is connected to the system voltage, whose source is connected to the I/O port, and whose drain is connected to a fifth node;

a fourth PMOS transistor whose gate is connected to the system voltage, whose source is connected to the I/O port, and whose drain is connected to the fourth node;

a fifth PMOS transistor whose gate is connected the fifth node, whose source is connected to the system voltage, and whose drain is connected to the second node connected to the I/O port; and a transmission gate including a sixth NMOS transistor and a sixth PMOS transistor which are connected in such a manner that the gate of the sixth NMOS transistor is connected to the system voltage and the gate of the sixth PMOS transistor is connected to the fourth node, and the two source/drain ends of the sixth NMOS transistor are respectively connected to the two source/drain ends of the sixth PMOS transistor, with one end connected to receive a second gate control signal and the other end connected to the fifth node.

In the foregoing I/O buffer, the floating N-well is connected to the substrate in which all the PMOS transistors are formed. Furthermore, when the I/O buffer operates in input mode, the first I/O control signal is switched to a low-voltage logic state, the first gate control signal is switched to a low-voltage logic state, and the second gate control signal is switched to a high-voltage logic state. In contrast, when the I/O buffer operates in output mode, the first I/O control signal is switched to a high-voltage logic state.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
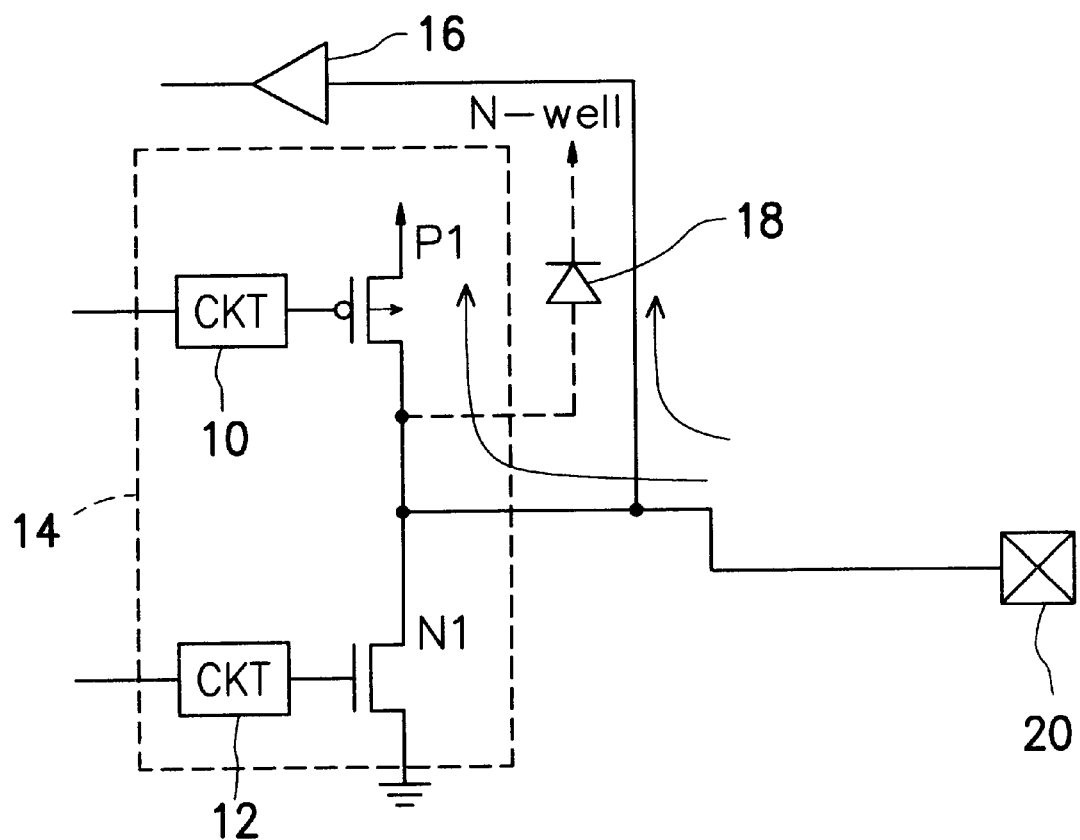
FIG. 1 is a schematic diagram showing the circuit structure of a conventional I/O buffer for use in a 3.3 V IC device.
Figure 2:
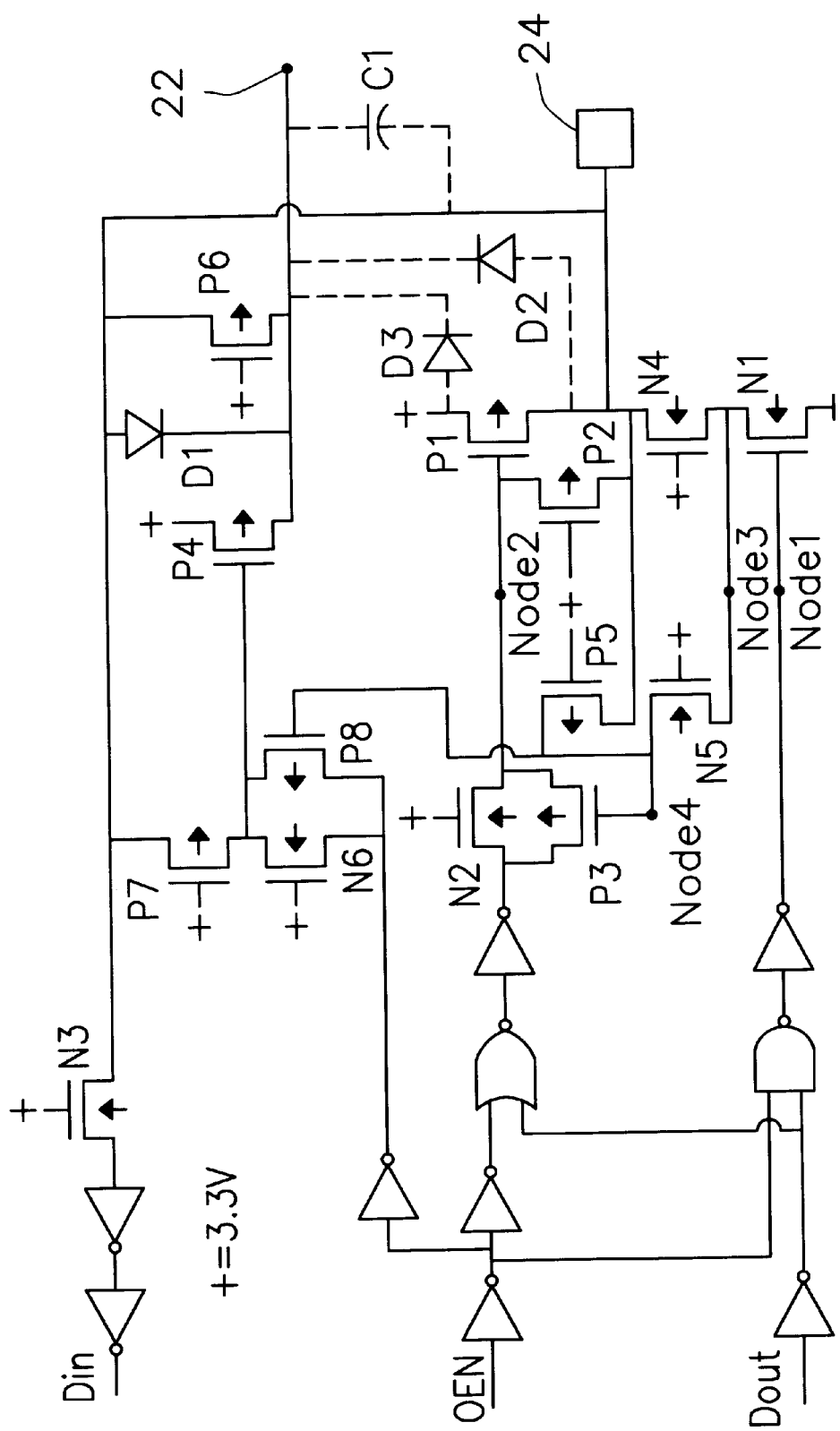
FIG. 2 is a schematic diagram showing the circuit structure of another conventional I/O buffer for use in a 3.3 V IC device which is published in IEEE JSSC.
Figure 3:
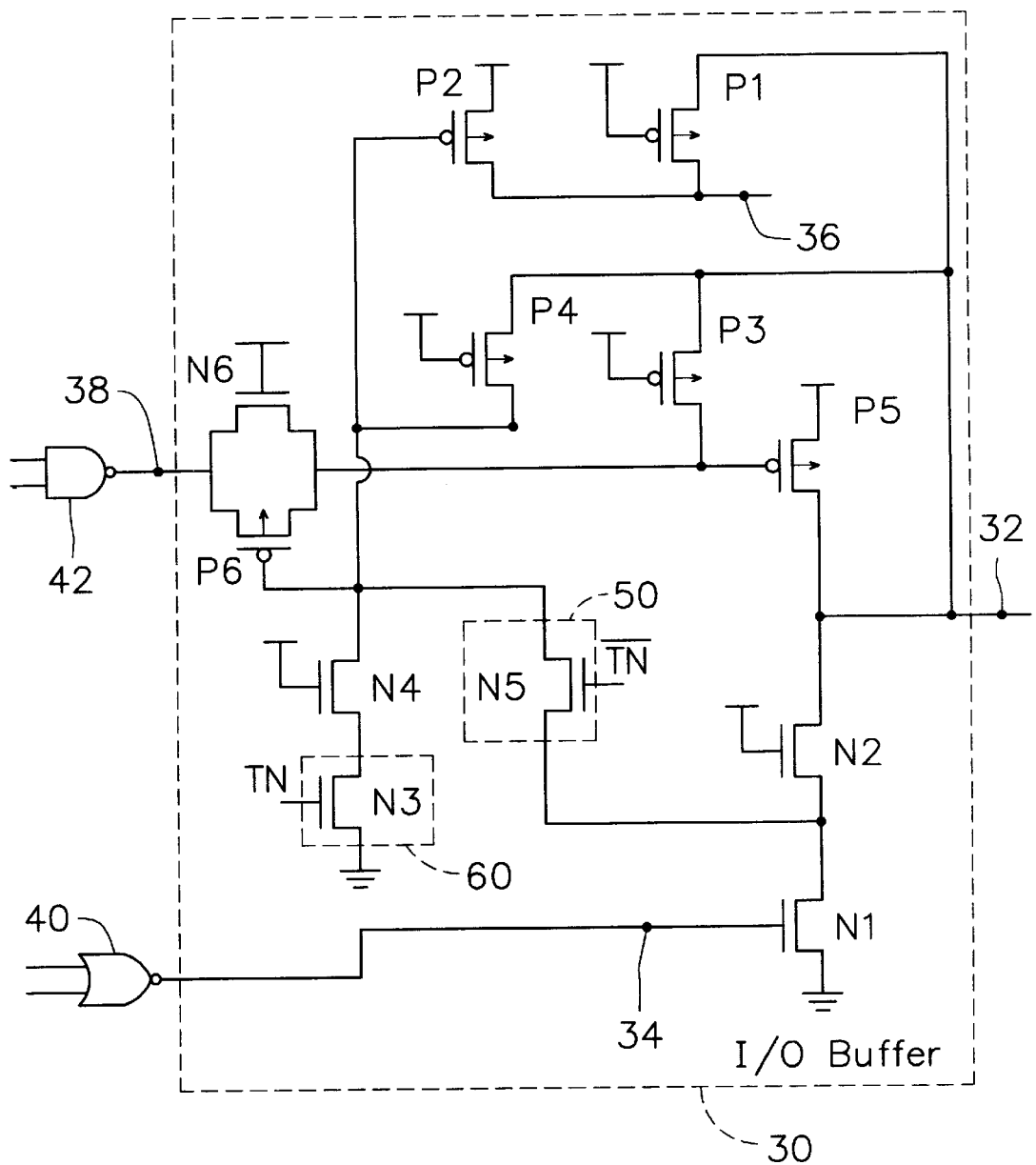
FIG. 3 is a schematic diagram showing the circuit structure of the I/O buffer of the invention, which is capable of accepting an input logic signal voltage higher in voltage level than the system voltage.

FIG. 3 is a schematic diagram showing the circuit structure of the I/O buffer of the invention, which is the part that is enclosed by the dashed box indicated by the reference numeral 30. This I/O buffer 30 is designed to be capable of accepting an input logic signal voltage higher in voltage level than the system voltage. In the following preferred embodiment of the invention, the system voltage is 3.3 V and the input logic signal is switched between 0 V and 5 V, of which the 5 V high-voltage logic state is higher in voltage level than the 3.3 V system voltage. However, it is to be understood that the invention is not limited to this preferred embodiment.

As shown in FIG. 3, the I/O buffer 30 of the invention includes six PMOS transistors P1, P2, P3, P4, P5, P6 and six NMOS transistors N1, N2, N3, N4, N5, N6. The sixth PMOS transistor P6 and the sixth NMOS transistor N6 are paired to form a transmission gate. Furthermore, the I/O buffer 30 is connected to one I/O port 32 of the IC device. The operation of the I/O buffer 30 is controlled by a first gate control signal from a NOR gate 40 and a second gate control signal from a NAND gate 42.

The first NMOS transistor N1 is connected in such a manner that its gate is connected via a wire 34 to the output end of the NOR gate 40; its source is connected to the ground; and its drain is connected to a first node A.

The second NMOS transistor N2 is connected in such a manner that its gate is connected to the 3.3 V system voltage; its source is connected to the first node A; and its drain is connected to a second node B (which is connected to the I/O port 32 of the IC device).

The third NMOS transistor N3 is connected in such a manner that its gate is connected to a first I/O control signal TN; its source is connected to the ground; and its drain is connected to a third node C.

The fourth NMOS transistor N4 is connected in such a manner that its gate is connected to the 3.3 V system voltage; its source is connected to the third node C connected to the drain of the third NMOS transistor N3; and its drain is connected to a fourth node D.

The fifth NMOS transistor N5 is connected in such a manner that its gate is connected to a second I/O control signal $\overline{TN}$ (whose value is the complement of the first I/O control signal TN connected to the gate of the third NMOS transistor N3); its source is connected to the first node A; and its drain is connected to the fourth node D.

The sixth NMOS transistor N6 is paired with the sixth PMOS transistor P6 to form a transmission (gate. The sixth NMOS transistor N6 is connected in such a manner that its gate is connected to the 3.3 V system voltage; its first source/drain end is connected to the output of the NAND gate 42; and its second source/drain end is connected to a fifth node E (which is connected to the gate of the fifth PMOS transistor P5).

The first PMOS transistor P1 is connected in such a manner that its gate is connected to the 3.3 V system voltage; its source is connected to the I/O port 32; and its drain is connected to a floating N-well 36 formed in the substrate of the IC device.

The second PMOS transistor P2 is connected in such a manner that its gate is connected to the fourth node D; its source is connected to the 3.3 V system voltage; and its drain is connected to the floating N-well 36.

The third PMOS transistor P3 is connected in such a manner that its gate is connected to the 3.3 V system voltage; its source is connected to the I/O port 32; and its drain is connected to the fifth node E connected to the gate of the fifth PMOS transistor P5.

The fourth PMOS transistor P4 is connected in such a manner that its gate is connected to the 3.3 V system voltage; its source is connected to the I/O port 32; and its drain is connected to the fourth node D.

The fifth PMOS transistor P5 is connected in such a manner that its gate is connected the fifth node E; its source is connected to the 3.3 V system voltage; and its drain is connected to the second node B connected to the I/O port 32.

The sixth PMOS transistor P6 is paired with the sixth NMOS transistor N6 to form a transmission gate. The sixth PMOS transistor P6 is connected in such a manner that its gate is connected to the fourth node D; its two source/drain ends are connected respectively to the two source/drain ends of the sixth NMOS transistor N6, with one source/drain end connected via the wire 38 to the output of the NAND gate 42, and the other source/drain end connected to the fifth node E connected to the gate of the fifth PMOS transistor P5.

Furthermore, the floating N-well 36 is connected to the substrate in which all the PMOS transistors P1, P2, P3, P4, P5, P6 are formed.

When the I/O buffer operates in input mode, the output 34 of the NOR gate 40 (i.e., the first gate control signal) is a low-voltage logic state. This state is transferred to the gate of the first NMOS transistor N1, switching the first NMOS transistor N1 into a non-conducting state. At the same time, the output 38 of the NAND gate 42 (i.e., the second gate control signal) is at a high-voltage logic state, which switches the fifth PMOS transistor P5 into a non-conducting state. Moreover, the I/O control signals TN=0 (0 V) and $\overline{TN}$=1 (3.3 V) are issued to the I/O buffer, respectively switching the third NMOS transistor N3 into a non-conducting state and the fifth NMOS transistor N5 into a conducting state. Under this condition, if the input signal to the I/O port 32 is 5 V, it can be transferred via the first PMOS transistor P1 (which is now in a conducting state due to its gate voltage being connected to the 3.3 V system voltage, which is lower than its 5 V source voltage connected to the I/O port 32) to the floating N-well 36, thus causing the floating N-well 36 to be set at 5 V. Furthermore, the second PMOS transistor P2 can be switched into a non-conducting state because its gate receives the 5 V input signal from the I/O port 32 via the fourth PMOS transistor P4 (which is now in a conducting state).

When the voltage state at the I/O port 32 is switched from 5 V to 0 V, it will cause the first PMOS transistor P1 to be switched into a non-conducting state. At this time, since the second NMOS transistor N2 and the fifth NMOS transistor N5 are in a conducting state, the 0 V input signal can be transferred via these two NMOS transistors N2, N5 to the gate of the second PMOS transistor P2, thereby causing the second PMOS transistor P2 to be switched into a conducting state. As a result of this, the 3.3 V system voltage is transferred via the second PMOS transistor P2 to the floating N-well 36, thereby setting the floating N-well 36 at 3.3 V. The undesired latchup effect that would occur in the prior art can be thus prevented and will not occur in the I/O buffer of the invention.

On the other hand, when the I/O buffer operates in output mode, the I/O control signals TN=1 (3.3 V) and $\overline{TN}$=0 (0 V) are issued to the I/O buffer, respectively causing the third NMOS transistor N3 to be switched into a conducting state and the fifth NMOS transistor N5 to be switched into a non-conducting state. At this time, since the source of the third NMOS transistor N3 is grounded and the fourth NMOS transistor N4 is in a conducting state, the gate voltage at the sixth PMOS transistor P6 is still maintained at 0 V, thereby maintaining the sixth PMOS transistor P6 in a conducting state. Furthermore, since the fifth NMOS transistor N5 is switched into a non-conducting state, the sixth PMOS transistor P6 will not be affected by the first NMOS transistor N1. As a result, the transmission (,ate (i.e., N6, P6) is switched into a conducting state. This allows the output 38 of the NAND gate 42 (i.e., the second gate control signal) to transmit through the transmission gate (N6, P6) to the gate of the fifth PMOS transistor P5, thereby switching the fifth PMOS transistor P5 into a conducting state. Meanwhile, the output 34 of the NOR gate 40 (i.e., the first gate control signal) can be used to switch the first NMOS transistor N1. This prevents formation of a short-circuit current between the fifth PMOS transistor P5 and the first NMOS transistor N1 that would occur in the prior art, and also allows a reduced time delay that increases the output performance of the I/O buffer.

The invention is not limited to the case of an I/O buffer, which is driven by a system voltage of 3.3 V and is used to receive logic signals that are switched between 0 V and 5 V. In general, the invention can be utilized in an I/O buffer that receives logic signals being switched between a low-voltage logic state and a high-voltage logic state, where the system voltage lies somewhere between the low-voltage logic state and the high-voltage logic state.

Broadly speaking, the third NMOS transistor N3 serves as a first switch 60 which is turned into a conducting state when the I/O buffer operates in output mode and into a non-conducting state when the I/O buffer operates in input mode. The ON/OFF state of the second switch 60 is controlled by the first I/O control signal TN. Furthermore, the fifth NMOS transistor N5 serves as a second switch 50 which is turned into a non-conducting state when the I/O buffer operates in output mode and into a conducting state when the I/O buffer operates in input mode. The ON/OFF state of the first switch 50 is controlled by the second I/O control signal $\overline{TN}$ whose value is the complement of the first I/O control signal TN connected to the first switch 60. Other electronic elements that can provide such switching functions can be used in place of the third NMOS transistor N3 and fifth NMOS transistor N5.

In conclusion, when the I/O buffer operates in input mode and when the voltage state at the I/O port 32 is switched from high-voltage logic state to low-voltage logic state, the NMOS transistors N2, N5 are switched into a conducting state, thereby transferring the low-voltage logic state to the gate of the second PMOS transistor P2, and thereby causing the second PMOS transistor P2 to transfer the 3.3 V voltage state to the floating N-well 36. With the floating N-well 36 being set at 3.3 V, the undesired latchup effect that would occur in the prior art is eliminated in the invention.

On the other hand, when the I/O buffer operates in output mode, the third NMOS transistor N3 is switched into a conducting state, thereby transferring the ground voltage to the gate of the sixth PMOS transistor P6 of the transmission gate (N6, P6), and thereby switching the transmission gate (N6, P6) into a conducting state. Therefore, the sixth PMOS transistor P6 and the first NMOS transistor N1 can be switched at the same time, such that the undesired short-circuit current that occurs in the prior art is eliminated in the invention and the output delay time is reduced.

The invention has been described using exemplary preferred embodiments. However, it is to be understood that the scope of the invention is not limited to the disclosed embodiments. On the contrary, it is intended to cover various modifications and similar arrangements The scope of the claims, therefore, should be accorded the broadest interpretation so as to encompass all such modifications and similar arrangements.

What is claimed is:

1. An I/O buffer for an IC device driven by a system voltage whose magnitude lies between a high-voltage logic state and a low-voltage logic state that are received via an I/O port, the I/O buffer comprising:

a floating N-well;

a first NMOS transistor whose gate is connected to receive a first gate control signal whose source is connected to the ground and whose drain is connected to a first node;

a second NMOS transistor whose gate is connected to the system voltage; whose source is connected to the first node; and whose drain is connected to a second node connected to the I/O port;

a third NMOS transistor whose gate is connected to a first I/O control signal; whose source is connected to the ground; and whose drain is connected to a third node;

a fourth NMOS transistor whose gate is connected to the system voltage; whose source is connected to the third node; and whose drain is connected to a fourth node;

a fifth NMOS transistor whose gate is connected to a second I/O control signal whose value is the complement of the first I/O control signal connected to the gate of the third NMOS transistor; whose source is connected to the first node; and whose drain is connected to the fourth node;

a first PMOS transistor whose gate is connected to the system voltage; whose source is connected to the I/O port; and whose drain is connected to the floating N-well;

a second PMOS transistor whose gate is connected to the fourth node; whose source is connected to the system voltage; and whose drain is connected to the floating N-well;

a third PMOS transistor whose gate is connected to the system voltage; whose source is connected to the I/O port; and whose drain is connected to a fifth node;

a fourth PMOS transistor whose gate is connected to the system voltage; whose source is connected to the I/O port; and whose drain is connected to the fourth node;

a fifth PMOS transistor whose gate is connected the fifth node; whose source is connected to the system voltage; and whose drain is connected to the second node connected to the I/O port; and a transmission gate including a sixth NMOS transistor and a sixth PMOS transistor which are connected in such a manner that the gate of the sixth NMOS transistor is connected to the system voltage and the gate of the sixth PMOS transistor is connected to the fourth node, in which the two source/drain ends of the sixth NMOS transistor are respectively connected to the two source/drain ends of the sixth PMOS transistor, with one end connected to receive a second gate control signal and the other end connected to the fifth node;

wherein the floating N-well is connected to the substrate on which all the PMOS transistors are formed;

wherein when the I/O buffer operates in input mode, the first I/O control signal is switched to a low-voltage logic state, the first gate control signal is switched to a low-voltage logic state, and the second gate control signal is switched to a high-voltage logic state; and wherein when the I/O buffer operates in output mode, the first I/O control signal is switched to a high-voltage logic state.

2. The I/O buffer of claim 1, wherein the first gate control signal is the output of a NOR gate, while the second gate control signal is the output of a NAND gate.

3. The I/O buffer of claim 1, wherein the system voltage is 3.3 V, while the low-voltage logic state is 0 V and the high-voltage logic state is 5 V.

4. An I/O buffer for an IC device driven by a system voltage whose magnitude lies between a high-voltage logic state and a low-voltage logic state that are received via an I/O port, the I/O buffer comprising:

a floating N-well, a first NMOS transistor whose gate is connected to receive a first gate control signal; whose source is connected to the ground; and whose drain is connected to a first node;

a second NMOS transistor whose gate is connected to the system voltage; whose source is connected to the first node; and whose drain is connected to a second node connected to the I/O port;

a first switch connected between the ground and a third node, whose ON/OFF state is controlled by a first I/O control signal in such a manner that the first switch is turned into a conducting state when the I/O buffer operates in output mode and into a non-conducting, state when the I/O buffer operates in input mode;

a fourth NMOS transistor whose gate is connected to the system voltage; whose source is connected to the third node; and whose drain is connected to a fourth node;

a second switch connected between the first node and the fourth node, whose ON/OFF state is controlled by a second I/O control signal whose value is the complement of the first I/O control signal used to control the first switch, in such a manner that the second switch is turned into a non-conducting state when the I/O buffer operates in output mode and into a conducting state when the I/O buffer operates in input mode;

a first PMOS transistor whose gate is connected to the system voltage; whose source is connected to the I/O port; and whose drain is connected to the floating N-well;

a second PMOS transistor whose gate is connected to the fourth node; whose source is connected to the system voltage; and whose drain is connected to the floating N-well;

a third PMOS transistor whose gate is connected to the system voltage; whose source is connected to the I/O port; and whose drain is connected to a fifth node;

a fourth PMOS transistor whose gate is connected to the system voltage; whose source is connected to the I/O port; and whose drain is connected to the fourth node;

a fifth PMOS transistor whose gate is connected the fifth node; whose source is connected to the system voltage; and whose drain is connected to the second node connected to the I/O port; and a transmission gate including a sixth NMOS transistor and a sixth PMOS transistor which are connected in such a manner that the gate of the sixth NMOS transistor is connected to the system voltage and the gate of the sixth PMOS transistor is connected to the fourth node, in which the two source/drain ends of the sixth NMOS transistor are respectively connected to the two source/drain ends of the sixth PMOS transistor, with one end connected to receive a second gate control signal and the other end connected to the fifth node;

wherein the floating N-well is connected to the substrate on which all the PMOS transistors are formed;

wherein when the I/O buffer operates in input mode, the first I/O control signal is switched to a low-voltage logic state, the first gate control signal is switched to a low-voltage logic state, and the second gate control signal is switched to a high-voltage logic state; and wherein when the I/O buffer operates in output mode, the first I/O control signal is switched to a high-voltage logic state.

5. The I/O buffer of claim 4, wherein the first switch is an NMOS transistor whose gate is connected to the first I/O control signal; whose source is connected to the ground; and whose drain is connected to the third node.

6. The I/O buffer of claim 4, wherein the second switch is an NMOS transistor whose gate is connected to the complement of the first I/O control signal; whose source is connected to the first node; and whose drain is connected to the fourth node.

* * * * *